US010973320B2

(12) United States Patent
Lee et al.

(10) Patent No.: US 10,973,320 B2
(45) Date of Patent: Apr. 13, 2021

(54) WINE BOTTLE FIXING DEVICE

(71) Applicants:Shih-Chi Lee, Taipei (TW); Hsi-Pin Chuang, Taipei (TW); Chih-Mao Ho, Taipei (TW)

(72) Inventors: Shih-Chi Lee, Taipei (TW); Hsi-Pin Chuang, Taipei (TW); Chih-Mao Ho, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 3 days.

(21) Appl. No.: 16/384,956

(22) Filed: Apr. 16, 2019

(65) Prior Publication Data
US 2020/0170409 A1  Jun. 4, 2020

Related U.S. Application Data

(60) Provisional application No. 62/772,635, filed on Nov. 29, 2018.

(51) Int. Cl.
*A47B 73/00* (2006.01)
*H03K 17/95* (2006.01)

(52) U.S. Cl.
CPC .......... *A47B 73/004* (2013.01); *A47B 73/006* (2013.01); *H03K 17/9517* (2013.01)

(58) Field of Classification Search
CPC ............... A47B 73/004; A47B 73/006; H03K 17/9517; E05B 73/0041; B65D 2203/10; G06Q 20/203; F25D 2331/803
(Continued)

(56) References Cited

U.S. PATENT DOCUMENTS 3,500,649 A * 3/1970 Feldman ................. F25B 21/02
62/3.6
5,602,530 A * 2/1997 Holmgren ........... E05B 73/0017
215/201
(Continued)

FOREIGN PATENT DOCUMENTS

CN  103838279  1/2017
JP  H1159718  3/1999
(Continued)

*Primary Examiner* — Patrick D Hawn
(74) *Attorney, Agent, or Firm* — JCIPRNET

(57) ABSTRACT

A wine bottle fixing device including a cylindrical body, a sliding component slidably disposed at the cylindrical body, and a first sensing component is provided. The cylindrical body surrounds an accommodating space and has an opening. The wine bottle is adapted to be inserted into the accommodating space through the opening. The sliding component is adapted to slide between a first position and a second position along an axis. The first sensing component includes a first sensor and a first sensed component. One of the first sensor and the first sensed component is disposed on the sliding component, and the other is located beside the opening. The first sensor is adapted to detect the first sensed component when the sliding component is at the first position and close to the opening. When the bottle neck portion of the wine bottle is inserted into the cylindrical body, the wine bottle pushes the sliding component from the first position to the second position, so that a sensed value of the first sensor sensing the first sensed component is changed. A wine cabinet is also provided.

15 Claims, 10 Drawing Sheets

(58) Field of Classification Search
USPC .............................. 248/312; 62/457.8, 457.5
See application file for complete search history.

(56) References Cited

U.S. PATENT DOCUMENTS

| | | | | |
|---|---|---|---|---|
| 5,957,313 | A * | 9/1999 | Bouan | B65D 45/32 |
| | | | | 215/215 |
| 6,230,905 | B1 * | 5/2001 | Camblor | A47B 73/004 |
| | | | | 211/74 |
| 6,822,567 | B2 * | 11/2004 | Durbin | E05B 73/0041 |
| | | | | 215/201 |
| 7,004,340 | B2 * | 2/2006 | Belden, Jr. | B65D 55/14 |
| | | | | 215/215 |
| 7,007,523 | B2 * | 3/2006 | Belden, Jr. | B65D 55/14 |
| | | | | 206/1.5 |
| 7,061,382 | B2 * | 6/2006 | Claessens | G06Q 20/207 |
| | | | | 340/572.8 |
| 7,350,653 | B2 * | 4/2008 | Belden, Jr. | B65D 55/14 |
| | | | | 215/215 |
| 7,350,654 | B2 * | 4/2008 | Belden, Jr. | B65D 55/14 |
| | | | | 215/215 |
| 7,350,655 | B2 * | 4/2008 | Belden, Jr. | B65D 55/14 |
| | | | | 215/215 |
| 7,364,089 | B2 * | 4/2008 | Claessens | B65D 55/02 |
| | | | | 235/375 |
| 7,372,363 | B2 * | 5/2008 | Durbin | E05B 73/00 |
| | | | | 215/201 |
| 7,866,497 | B2 * | 1/2011 | Belden, Jr. | E05B 73/0041 |
| | | | | 215/223 |
| 8,267,259 | B2 * | 9/2012 | Fisher | A47B 73/004 |
| | | | | 211/75 |
| 8,267,326 | B2 * | 9/2012 | Kolton | B65D 23/14 |
| | | | | 235/492 |
| 8,368,537 | B2 * | 2/2013 | Zhang | E05B 73/0041 |
| | | | | 340/568.1 |
| 8,525,675 | B2 * | 9/2013 | Zhang | E05B 73/0041 |
| | | | | 340/568.1 |
| 8,604,908 | B1 * | 12/2013 | Kuniavsky | G05B 19/00 |
| | | | | 340/5.92 |
| 8,756,940 | B2 * | 6/2014 | Doucet | F25D 31/007 |
| | | | | 62/3.6 |
| 8,887,541 | B2 * | 11/2014 | Zhang | E05B 73/0017 |
| | | | | 70/57.1 |
| 9,206,628 | B2 * | 12/2015 | Zhang | E05B 73/0041 |
| 9,311,797 | B2 * | 4/2016 | Yang | G08B 13/2434 |
| 9,472,073 | B2 * | 10/2016 | Yang | G08B 13/2434 |
| 10,521,766 | B2 * | 12/2019 | Alvarez | G06Q 10/0875 |
| 10,643,117 | B2 * | 5/2020 | Nooner | G06K 19/07709 |
| 10,737,836 | B2 * | 8/2020 | Carpenter | B65D 23/065 |
| 2002/0000908 | A1 * | 1/2002 | Burg, II | B65D 51/248 |
| | | | | 340/328 |
| 2003/0102279 | A1 * | 6/2003 | Michael | B65D 50/067 |
| | | | | 215/204 |
| 2005/0017865 | A1 * | 1/2005 | Belden, Jr. | B65D 55/14 |
| | | | | 340/572.9 |
| 2005/0144992 | A1 * | 7/2005 | Belden, Jr. | B65D 55/14 |
| | | | | 70/57.1 |
| 2005/0205511 | A1 * | 9/2005 | Belden, Jr. | E05B 73/0041 |
| | | | | 215/204 |
| 2006/0026971 | A1 * | 2/2006 | Sharpe | G01K 13/00 |
| | | | | 62/126 |
| 2006/0043049 | A1 * | 3/2006 | Belden, Jr. | B65D 55/14 |
| | | | | 215/215 |
| 2006/0043050 | A1 * | 3/2006 | Belden, Jr. | E05B 73/0041 |
| | | | | 215/215 |
| 2007/0191983 | A1 * | 8/2007 | Griffits | G07F 9/02 |
| | | | | 700/213 |
| 2008/0272916 | A1 * | 11/2008 | Breysse | B65D 55/06 |
| | | | | 340/572.8 |
| 2009/0152230 | A1 * | 6/2009 | Belden, Jr. | E05B 73/0041 |
| | | | | 215/221 |
| 2010/0132831 | A1 * | 6/2010 | Waroux | F25D 31/007 |
| | | | | 141/66 |
| 2010/0258698 | A1 * | 10/2010 | Fisher | A47B 73/004 |
| | | | | 248/312 |
| 2011/0219828 | A1 * | 9/2011 | Zhang | E05B 73/0017 |
| | | | | 70/58 |
| 2012/0168398 | A1 * | 7/2012 | Zhang | E05B 73/0041 |
| | | | | 215/201 |
| 2013/0240572 | A1 * | 9/2013 | Moezidis | B67D 1/1277 |
| | | | | 222/394 |
| 2019/0071216 | A1 * | 3/2019 | Carpenter | B65D 23/065 |
| 2020/0121079 | A1 * | 4/2020 | Wang | A47B 73/004 |
| 2020/0157854 | A1 * | 5/2020 | Piccoli | B65D 55/14 |
| 2020/0184304 | A1 * | 6/2020 | Nooner | G06F 3/167 |
| 2020/0299040 | A1 * | 9/2020 | White | B65D 55/14 |

FOREIGN PATENT DOCUMENTS

| | | |
|---|---|---|
| JP | 2010082217 | 4/2010 |
| JP | 3211237 | 6/2017 |
| TW | I470414 | 1/2015 |
| TW | M553350 | 12/2017 |
| WO | 2017059543 | 4/2017 |

* cited by examiner

WINE BOTTLE FIXING DEVICE

CROSS-REFERENCE TO RELATED APPLICATION

This application claims the priority benefit of U.S. provisional application Ser. No. 62/772,635, filed on Nov. 29, 2018. The entirety of the above-mentioned patent application is hereby incorporated by reference herein and made a part of this specification.

BACKGROUND

Technical Field

The invention relates to a wine bottle fixing device and a wine cabinet, and particularly relates to a wine bottle fixing device and a wine cabinet having a sensing function.

Description of Related Art

Generally, the most common way to store wine bottles is to place the wine bottles in a wooden wine cabinet. However, along with increase of the amount of stored wines, a storage time of each bottle of wine is often difficult to control. Moreover, as years pass by, it is often easy to forget the type and a storage location of each bottle of wine, and if combined with uncertain factors such as flaking of labels of the wine bottles over time, it will cause difficulties in wine management. Therefore, how to easily and effectively management the stored wine is a problem that needs to be solved at present.

SUMMARY

The invention is directed to a wine bottle fixing device, which is adapted to fix a wine bottle and sense whether the wine bottle is inserted.

The invention is directed to a wine cabinet, which has the aforementioned wine bottle fixing device.

The invention provides a wine bottle fixing device, adapted for insertion of a bottle neck portion of a wine bottle to fix the wine bottle. The wine bottle fixing device includes a cylindrical body, a sliding component and a first sensing assembly. The cylindrical body surrounds an accommodating space and has an opening, where the bottle neck portion of the wine bottle is adapted to be inserted into the accommodating space through the opening. The sliding component is slidably disposed at the cylindrical body, and is adapted to slide between a first position and a second position along an axis. The first sensing assembly includes a first sensor and a first sensed component corresponding to the first sensor. One of the first sensor and the first sensed component is disposed on the sliding component, and the other one is disposed beside the opening of the cylindrical body. When the sliding component is located at the first position, the sliding component is close to the opening, and the first sensor is adapted to detect the first sensed component. When the bottle neck portion of the wine bottle is inserted into the cylindrical body, the wine bottle pushes the sliding component to slide from the first position to the second position, so that a sensed value of the first sensor sensing the first sensed component is changed.

In an embodiment of the invention, the wine bottle fixing device further includes an elastic component disposed in the accommodating space, and the elastic component is located between a bottom wall of the cylindrical body and the sliding component. When the bottle neck portion of the wine bottle is inserted into the cylindrical body, the bottle neck portion of the wine bottle pushes the sliding component to slide to the second position, the elastic component is compressed by the sliding component to accumulate elastic potential energy. When the bottle neck portion leaves the cylindrical body, the elastic component is adapted to release the elastic potential energy to push the sliding component to return to the first position.

In an embodiment of the invention, the wine bottle fixing device further includes at least one roller set, where each of the roller sets includes a plurality of rollers. The cylindrical body includes a plurality of slots formed on a wall surface and communicated with the accommodating space. The rollers are rotatably disposed on the slots and partially stretched into the accommodating space. When the bottle neck portion of the wine bottle is inserted into the accommodating space, the rollers are adapted to contact the wine bottle.

In an embodiment of the invention, the cylindrical body includes a plurality of roller frames corresponding to the slots, and the roller frames are located at an outer side of the wall surface of the cylindrical body. Each of the roller frames has an inclined track. A shaft rod of each roller penetrates through the inclined track. Each of the inclined tracks includes a first end and a second end opposite to each other, where the first end is close to the opening and away from the wall surface, and the second end is away from the opening and close to the wall surface.

In an embodiment of the invention, the number of the at least one roller set is two, where one of the roller sets is disposed around the cylindrical body and is close to the opening, and the other one of the roller sets is disposed around the cylindrical body and is away from the opening.

In an embodiment of the invention, orthographic projections of the rollers of the roller sets on a bottom wall of the cylindrical body are staggered from each other.

In an embodiment of the invention, the first sensing component is a magnetic sensor, and the first sensed component is a magnet.

The invention provides a wine cabinet including a cabinet body, a door plank pivotally connected to the cabinet body and a plurality of the aforementioned wine bottle fixing devices disposed in the cabinet body.

In an embodiment of the invention, the wine cabinet further includes a second sensing assembly, the second sensing assembly includes a second sensor and a second sensed component corresponding to the second sensor, where one of the second sensor and the second sensed component is disposed on the door plank, and the other one is disposed on the cabinet body. When the door plank is closed, the second sensor is adapted to detect the second sensed component. When the door plank is rotated relative to the cabinet body to open, the second sensed component leaves a sensing range of the second sensor.

Based on the above description, in the wine bottle fixing device of the invention, the sliding component is slidably disposed on the cylindrical body, and one of the sensed component and the sensor is disposed on the sliding component, and the other one is disposed beside the opening of the cylindrical body. Therefore, when the wine bottle is inserted into the cylindrical body from the opening, the bottle neck portion of the wine bottle pushes the sliding component, so that the sensed value of the sensor sensing the sensed component is changed. In this way, the sensing assembly of the invention is capable of automatically detecting whether the wine bottle is put into the wine bottle fixing device. The wine cabinet of the invention has the aforementioned wine bottle fixing devices, and is capable of efficiently managing storage time of the stored wines, and providing an objective basis for the user to judge whether the wine is suitable for drinking at this time point.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
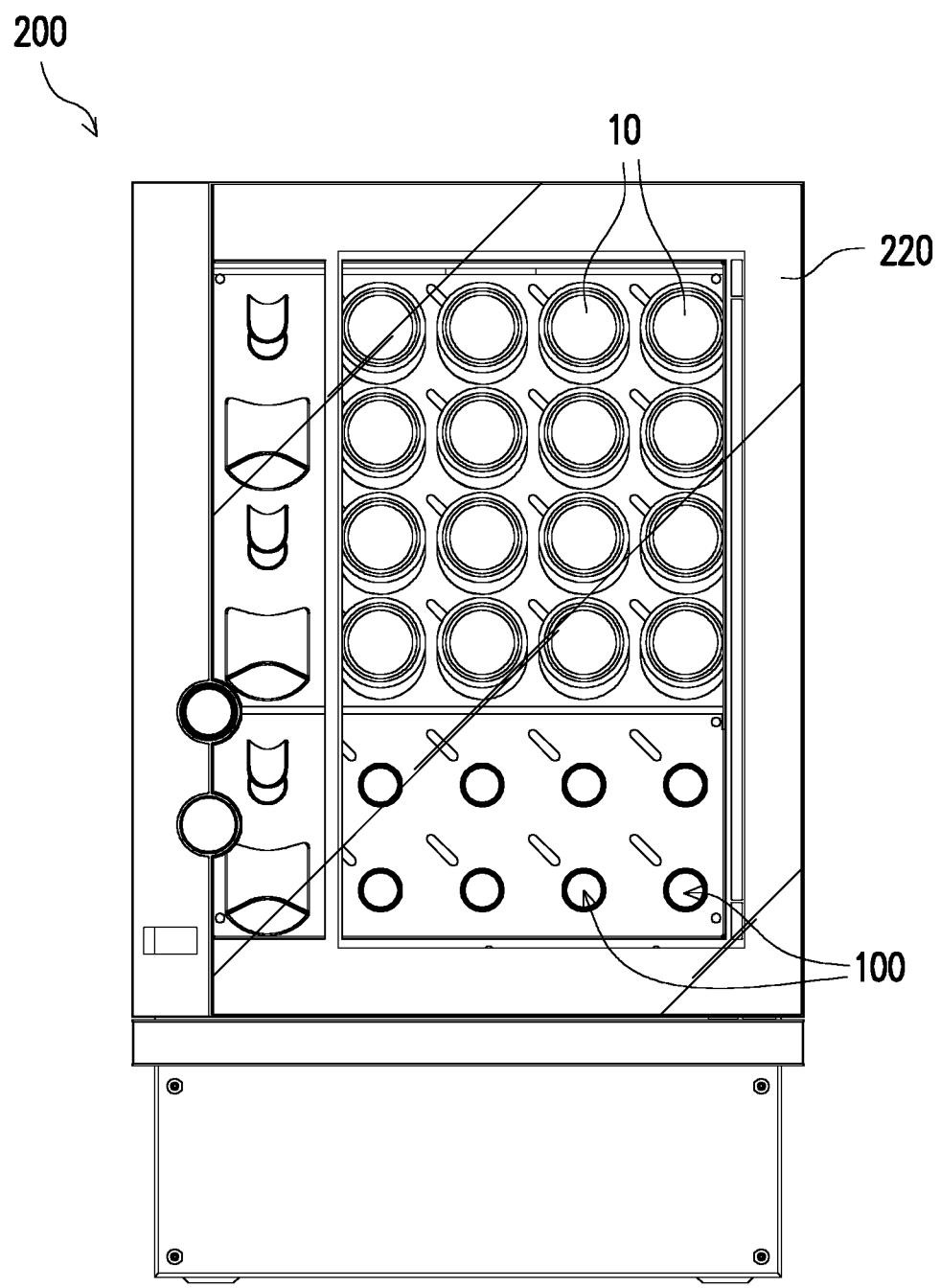
FIG. 1 is a schematic diagram of a wine cabinet according to an embodiment of the invention.

FIG. 1 is a schematic diagram of a wine cabinet according to an embodiment of the invention. Referring to FIG. 1, in the embodiment, a wine cabinet 200 includes a plurality of wine bottle fixing devices 100, and a bottle neck portion 15 (referring to FIG. 3) of a wine bottle 10 is adapted to be inserted into and fixed in the wine bottle fixing device 100. The wine bottle fixing device 100 has a function of sensing whether the bottle neck portion 15 of the wine bottle 10 is inserted, and is adapted to transmit a sensing result to a circuit board module (not shown) in the wine cabinet 200.

In the embodiment, the wine cabinet 200 selectively has a smart system management function. For example, the wine cabinet 200 may has a recognizer, which may obtain information of such bottle of wine by, for example, scanning a barcode of the wine bottle to be put in or photographing a wine label thereon, and transmit the information to the system, and then the wine bottle 10 is fixed to the wine bottle fixing devices 100. In this way, the wine cabinet 200 may record which wines are placed in it.

When the user wants to take a bottle of wine, a door plank 220 of the wine cabinet 200 may be a display panel, which may display all kinds of information of the wines stored in the wine cabinet 200, or may even be connected to the system through the Internet to provide information related to meals that are suitable for these wines to the user, or may even suggest or remind the user to add which kinds of wine. After the user selects the bottle of wine to be taken from the wine cabinet 200 according to the information displayed on the door plank 220, a lamp next to the bottle of wine may be lighted to indicate which bottle of wine the user wants to take.

Moreover, the door plank 220 may also be selected by the user to serve as a transparent door plank or a display panel. When the user selects the door plank 220 to be transparent, the user may clearly observe a wine storage status within the wine cabinet 200 through the door panel 220. When the user selects the door plank 220 to be the display panel, the display panel may display related information of the stored wines. Certainly, in other embodiments, the wine bottle fixing devices 100 are not limited to be configured on the wine cabinet 200, but may also be configured on equipment with other functions, which is not limited by the invention.

A structure of the wine bottle fixing device 100 is described in detail below.

Figure 2:
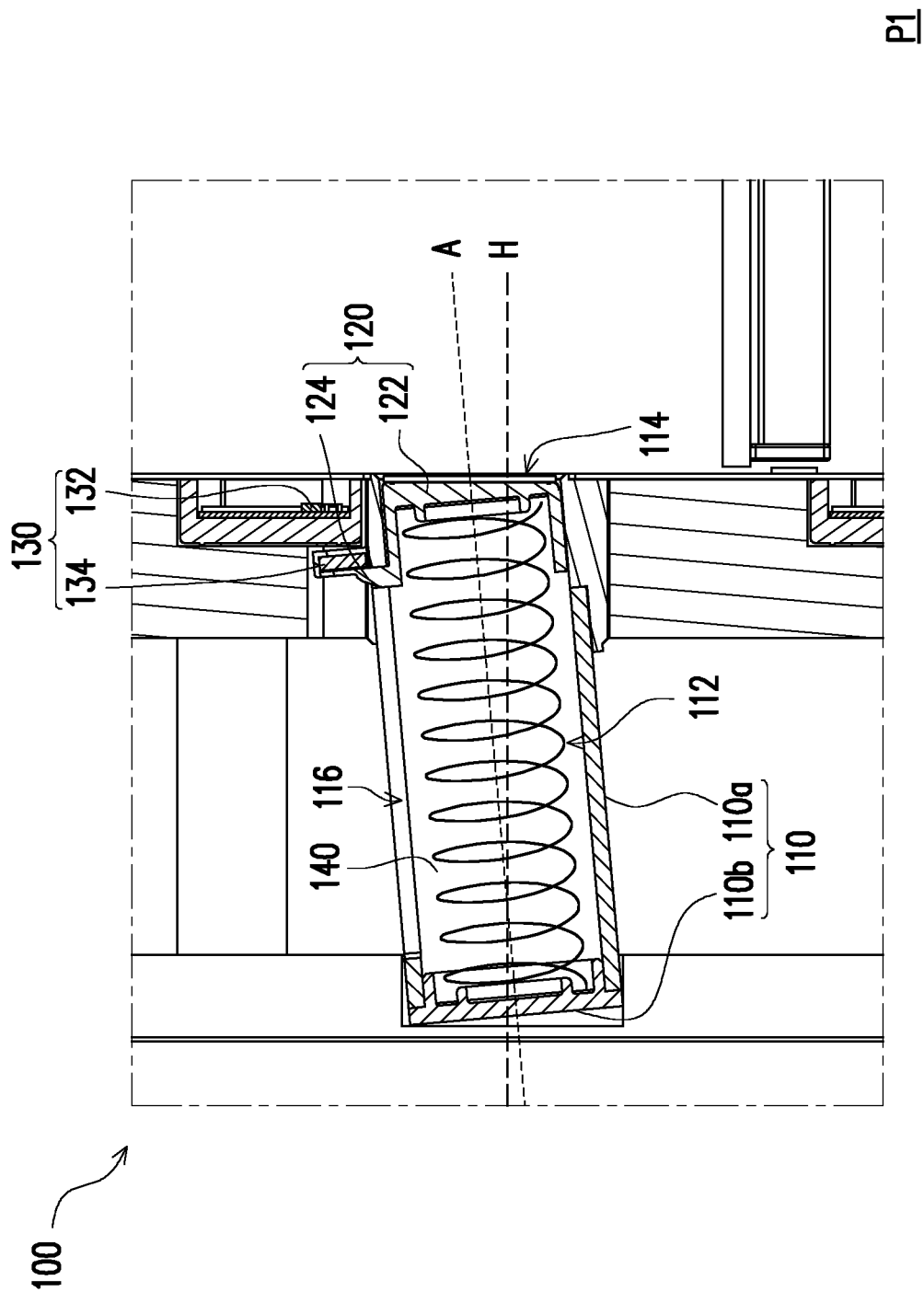
FIG. 2 is a partial cross-sectional view of a wine bottle fixing device of the wine cabinet of FIG. 1 when a wine bottle is not yet inserted.
Figure 3:
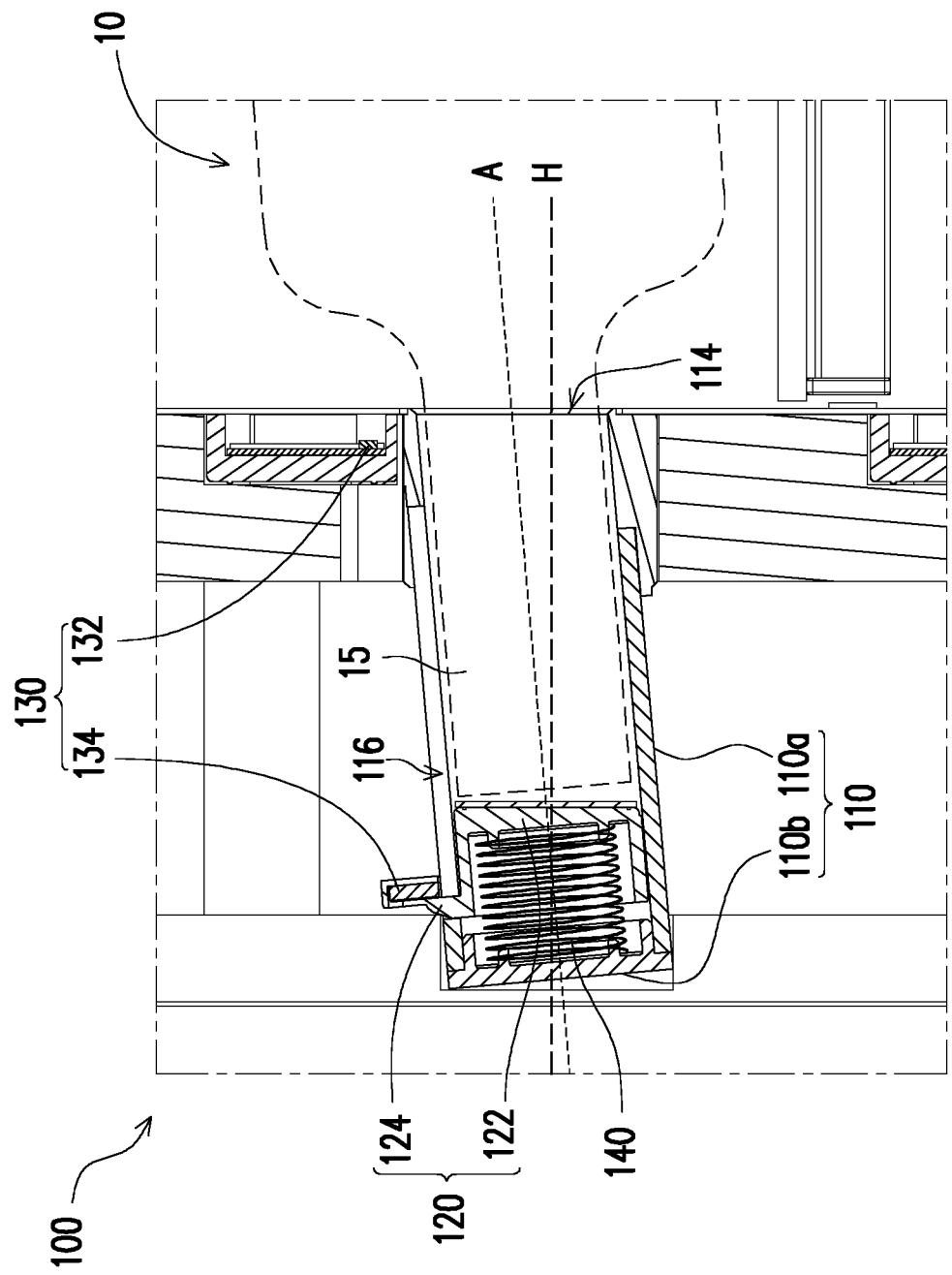
FIG. 3 is a partial cross-sectional view of the wine bottle fixing device of the wine cabinet of FIG. 1 when a wine bottle is inserted.
Figure 4:
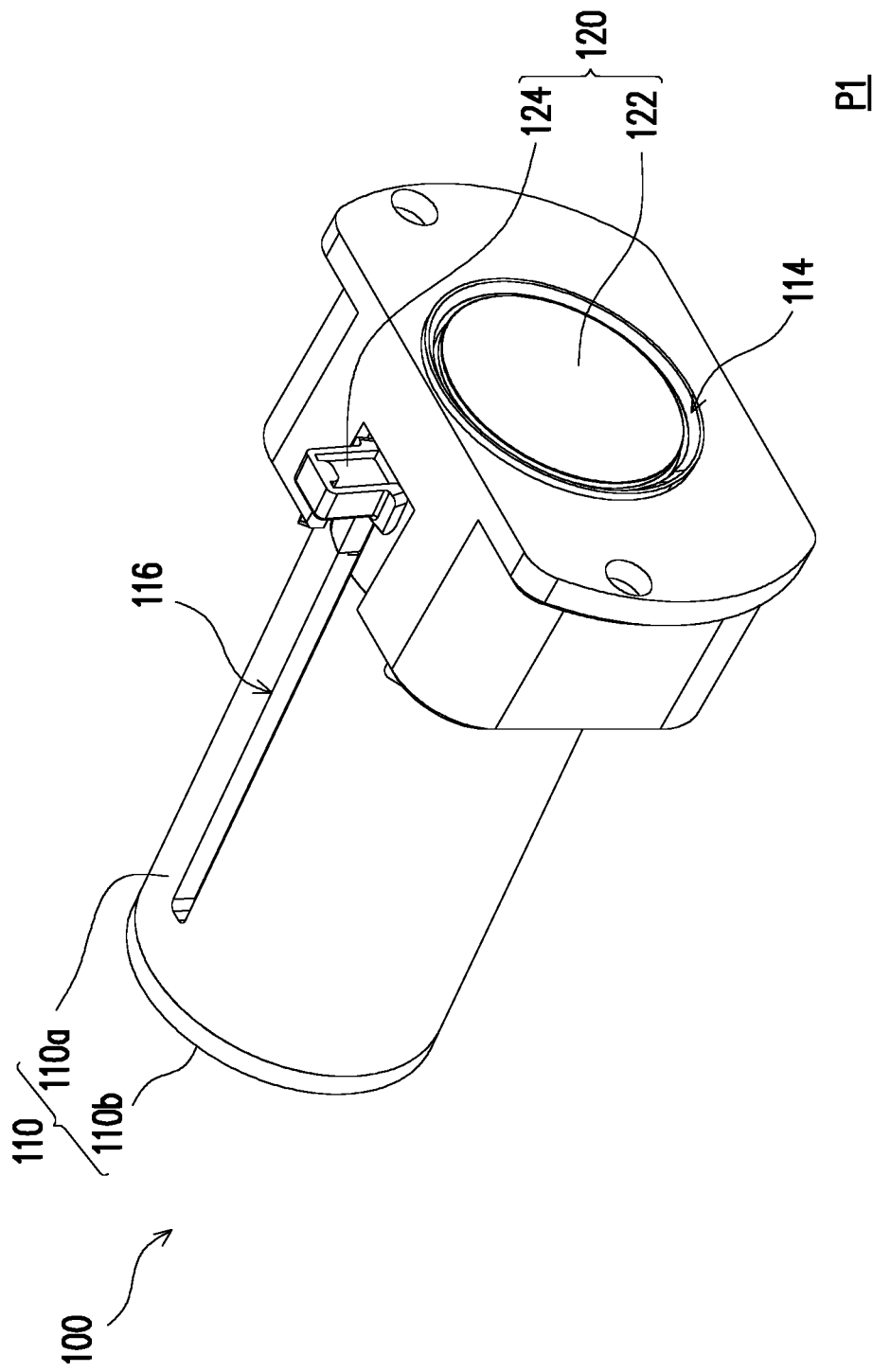
FIG. 4 is a schematic diagram of the wine bottle fixing device of the wine cabinet of FIG. 1.

FIG. 2 is a partial cross-sectional view of a wine bottle fixing device of the wine cabinet of FIG. 1 when a wine bottle is not yet inserted. FIG. 3 is a partial cross-sectional view of the wine bottle fixing device of the wine cabinet of FIG. 1 when a wine bottle is inserted. FIG. 4 is a schematic diagram of the wine bottle fixing device of the wine cabinet of FIG. 1. Referring to FIG. 2 to FIG. 4, in the embodiment, the wine bottle fixing device 100 includes a cylindrical body 110 and a sliding component 120. The cylindrical body 110 has an opening 114, and the cylindrical body 110 surrounds an accommodating space 112. Therefore, the bottle neck portion 15 of the wine bottle 10 is adapted to be inserted into the accommodating space 112 of the cylindrical body 110 through the opening 114.

In detail, the sliding component 120 is slidably disposed at the cylindrical body 110, and the sliding component 120 is adapted to slide between a first position P1 and a second position P2 along an axis A. In the embodiment, the axis A and a horizontal line H have an included angle there between. To be specific, the axis A is slightly higher than the horizontal line H at the opening 114, and in the drawings, the opening 114 is close to the right side, so that the axis A is inclined in the drawings in a right-up-left-down manner. The cylindrical body 110 is configured on the wine cabinet 200 along the axis A. Namely, the opening 114 of the cylindrical body 110 is slightly higher than a bottom wall 110b. The included angle between the axis A and the horizontal line H is, for example, 3 degrees and 30 degrees, though the invention is not limited thereto.

Since the bottle neck portions 15 of different wine bottles 10 are probably different, and a diameter of the bottle neck portion 15 is about between 27 cm and 33 cm, when the bottle neck portion 15 of the wine bottle 10 is inserted into the cylindrical body 110, the wine bottle 10 is more easily fixed in the accommodating space 112 and is not easy to slip out of the cylindrical body 110 due to the inclination design. Certainly, in order to save a space, in the embodiment, the included angle between the axis A and the horizontal line H may not be too large, which may be, for example, 5 degrees, so that the wine cabinet 200 (FIG. 1) may store more rows of wines under a limited space, though the invention is not limited thereto.

In the embodiment, the cylindrical body 110 further includes a sliding chute 116 formed on a wall surface 110a of the cylindrical body 110, and the sliding chute 116 extends along the axis A and is communicated with the accommodating space 112 of the cylindrical body 110. Moreover, the sliding component 120 further includes a push portion 122 located in the accommodating space 112 and a protrusion portion 124 connected to the push portion 122, and the protrusion portion 124 of the sliding component 120 protrudes out of the wall surface 110a of the cylindrical body 110 from the sliding chute 116.

In the embodiment, when the bottle neck portion 15 of the wine bottle 10 is inserted into the wine bottle fixing device 100, the push portion 122 of the sliding component 120 is pushed by the wine bottle 10, and slides in the accommodating space 112, and the protrusion portion 124 of the sliding component 120 is accordingly moved. A part of the protrusion portion 124 slides in the sliding chute 116, and the other part of the protrusion portion 124 protrudes out of the wall surface 110a of the cylindrical body 110.

Moreover, in the embodiment, the wine bottle fixing device 100 further includes a first sensing assembly 130. Further, the first sensing assembly 130 includes a first sensor 132 and a first sensed component 134 corresponding to the first sensor 132. In the embodiment, the first sensed component 134 is a magnet, and the first sensor 132 is a magnetic sensor, and is, for example, a Hall effect sensing component. Certainly, in other embodiments, sensing principles and types of the first sensed component 134 and the first sensor 132 are not limited thereto.

In the embodiment, the first sensed component 134 is disposed on the sliding component 120, for example, disposed on the protrusion portion 124 of the sliding component 120. The first sensor 132 is disposed beside the opening 114, for example, disposed on the wine cabinet 200 (FIG. 1) at a part close to the opening 114.

In the embodiment, when the wine bottle 10 is not inserted into the cylindrical body 110, the sliding component 120 is located at the first position P1, and the first sensor 132 disposed beside the opening 114 may detect the first sensed component 134 located on the protrusion portion 124. Therefore, it is learned that the wine bottle 10 is not yet inserted into the cylindrical body 110. When the wine bottle 10 is inserted into the cylindrical body 110, the sliding component 120 is moved from the first position P1 to the second position P2 to drive the first sensed component 134 to depart from the first sensor 132, and a sensed value of the first sensor 132 sensing the first sensed component 134 is changed, so that it is learned that the wine bottle 10 has been inserted into the cylindrical body 110. Namely, when the sensed value of the first sensor 132 sensing the first sensed component 134 is gradually decreased, it represents that the wine bottle 10 is inserted into the cylindrical body 110. Conversely, when the sensed value of the first sensor 132 sensing the first sensed component 134 is gradually increased, it represents that the wine bottle 10 leaves the cylindrical body 110.

Certainly, in other embodiments, positions of the first sensed component 134 and the first sensor 132 may also be reversed. Namely, the first sensed component 134 may also be disposed beside the opening 114, and the first sensor 132 may also be disposed on the sliding component 120 as long as the sensed value of the first sensor 132 sensing the first sensed component 134 is changed when the wine bottle 10 pushes the sliding component 120 to the second position P2.

Moreover, it should be noted that in other embodiments that are not illustrated, the first sensed component 134 is not necessarily disposed on the convex part 124, it may be disposed at any place of the sliding component 120 as long as the first sensor 132 may detect the first sensed component 134 when the sliding component 120 is located at the first position P1, and as long as the sensed value of the first sensor 132 sensing the first sensed component 134 is changed when the sliding component 120 is away from or close to the first position P1, which is not limited by the invention.

Referring to FIG. 2 to FIG. 4, in the embodiment, the wine bottle fixing device 100 further includes an elastic component 140 disposed in the accommodating space 112, and the elastic component 140 is located between a bottom wall 110b of the cylindrical body 110 and the sliding component 120. When the wine bottle 10 is not yet inserted into the wine bottle fixing device 100, the elastic component 140 is in an undeformed state, and the sliding component 120 is maintained to the first position P1 beside the opening 114.

When the wine bottle 10 is inserted into the accommodating space 112 in the cylindrical body 110 from the opening 114, the bottle neck portion 15 of the wine bottle 10 pushes the sliding component 120, and the sliding component 120 is moved to the second position P2. Now, the elastic component 140 is compressed by the sliding component 120 to accumulate elastic potential energy. In this case, the bottle neck portion 15 of the wine bottle 10 is stuck in the cylindrical body 110, and the sliding component 120 is fixed to the second position P2. When the user takes out the wine bottle 10 to make the bottle neck portion 15 of the wine bottle 10 to leave the cylindrical body 110, the elastic component 140 is adapted to release the elastic potential energy to push the sliding component 120 to return to the first position P1.

The wine bottle fixing device 100 of FIG. 2 fixes the wine bottle 10 as a partial inner surface of the cylindrical body 110 leans against the bottle neck portion 15 of the wine bottle 10. Certainly, the method that the wine bottle fixing device 100 fixes the wine bottle 10 is not limited thereto. Other embodiments are provided for further description. It should be noted that reference numbers of the components and a part of contents of the aforementioned embodiment are also used in the following embodiment, where the same reference numbers denote the same or like components, and descriptions of the same technical contents are omitted. Different features of each of the embodiments may also be applied to other embodiments in principle. The aforementioned embodiment may be referred for descriptions of the omitted parts, and detailed descriptions thereof are not repeated in the following embodiment.

Figure 5:
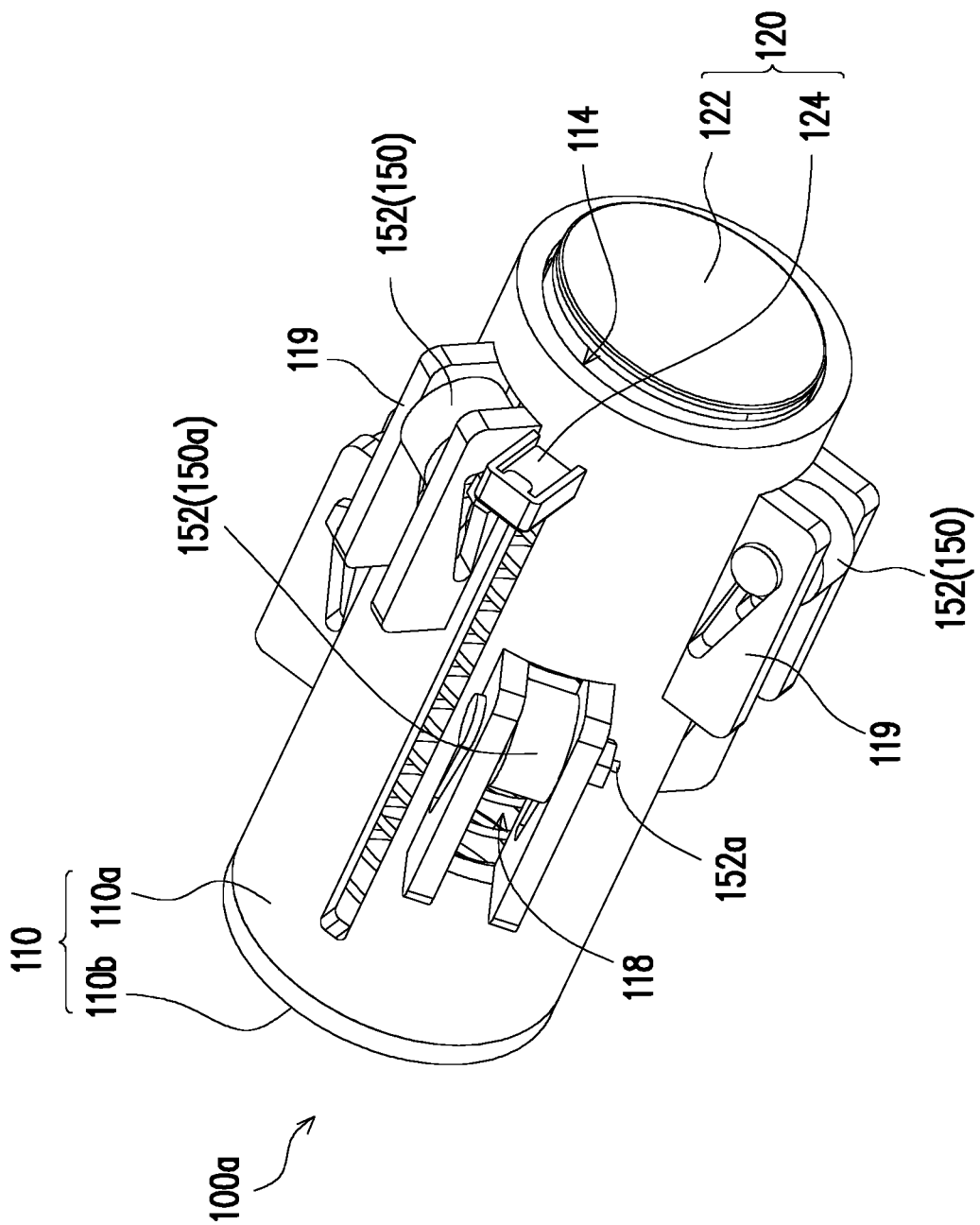
FIG. 5 is a schematic diagram of a wine bottle fixing device according to another embodiment of the invention.
Figure 6:
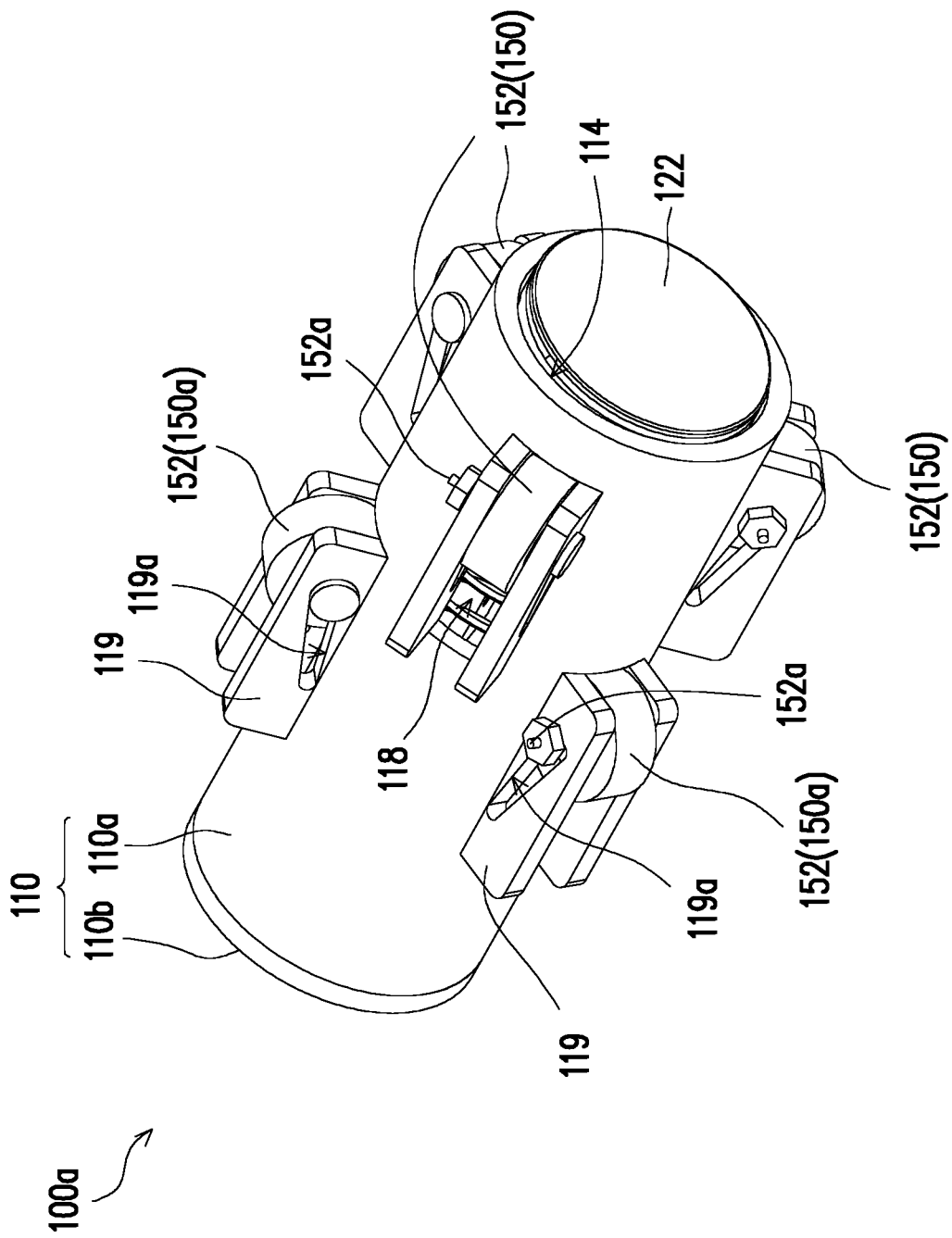
FIG. 6 is a schematic diagram of another viewing angle of the wine bottle fixing device of FIG. 5.

FIG. 5 is a schematic diagram of a wine bottle fixing device according to another embodiment of the invention. FIG. 6 is a schematic diagram of another viewing angle of the wine bottle fixing device of FIG. 5. Referring to FIG. 5 and FIG. 6, in the embodiment, the wine bottle fixing device 100a further includes at least one roller set 150 and 150a, and each of the roller sets 150 and 150a includes a plurality of rollers 152. In the embodiment, the number of the roller sets 150 and 150a is two, and the number of the rollers 152 in each of the roller sets 150 and 150a is three. Certainly, in other embodiments, the number of the roller sets 150 and 150a and the number of the rollers 152 included in each of the roller sets 150 and 150a may be adjusted according to an actual requirement, which is not limited by the invention.

In the embodiment, one of the roller sets 150 is disposed around the cylindrical body 110 and is close to the opening 114, and the other one of the roller sets 150a is disposed around the cylindrical body 110 and is away from the opening 114. Moreover, the rollers 152 of the roller set 150 and the rollers 152 of the roller set 150a are configured in interleaving. In other words, orthographic projections of the rollers 152 of the roller sets 150 and 150a on the bottom wall 110b of the cylindrical body 110 are staggered from each other. The design of the rollers 152 makes the bottle neck portion 15 of the wine bottle 10 to be easily inserted and taken out.

Moreover, in the embodiment, the cylindrical body 110 has a plurality of slots 118 formed on the wall surface 110a, and a plurality of roller frames 119 corresponding to the slots 118. The slots 118 are communicated with the accommodating space 112 of the cylindrical body 110. Each of the roller frames 119 is disposed at the corresponding slot 118, and is located at an outer side of the wall surface 110a. The rollers 152 are rotatably disposed on the roller frames 119. Each of the roller frames 119 further has an inclined track 119a, a shaft rod 152a of each roller 152 rotatably penetrates through the corresponding inclined track 119a, and the rollers 152 are partially stretched into the accommodating space 112 through the slots 118 (shown in FIG. 7).

Figure 7:
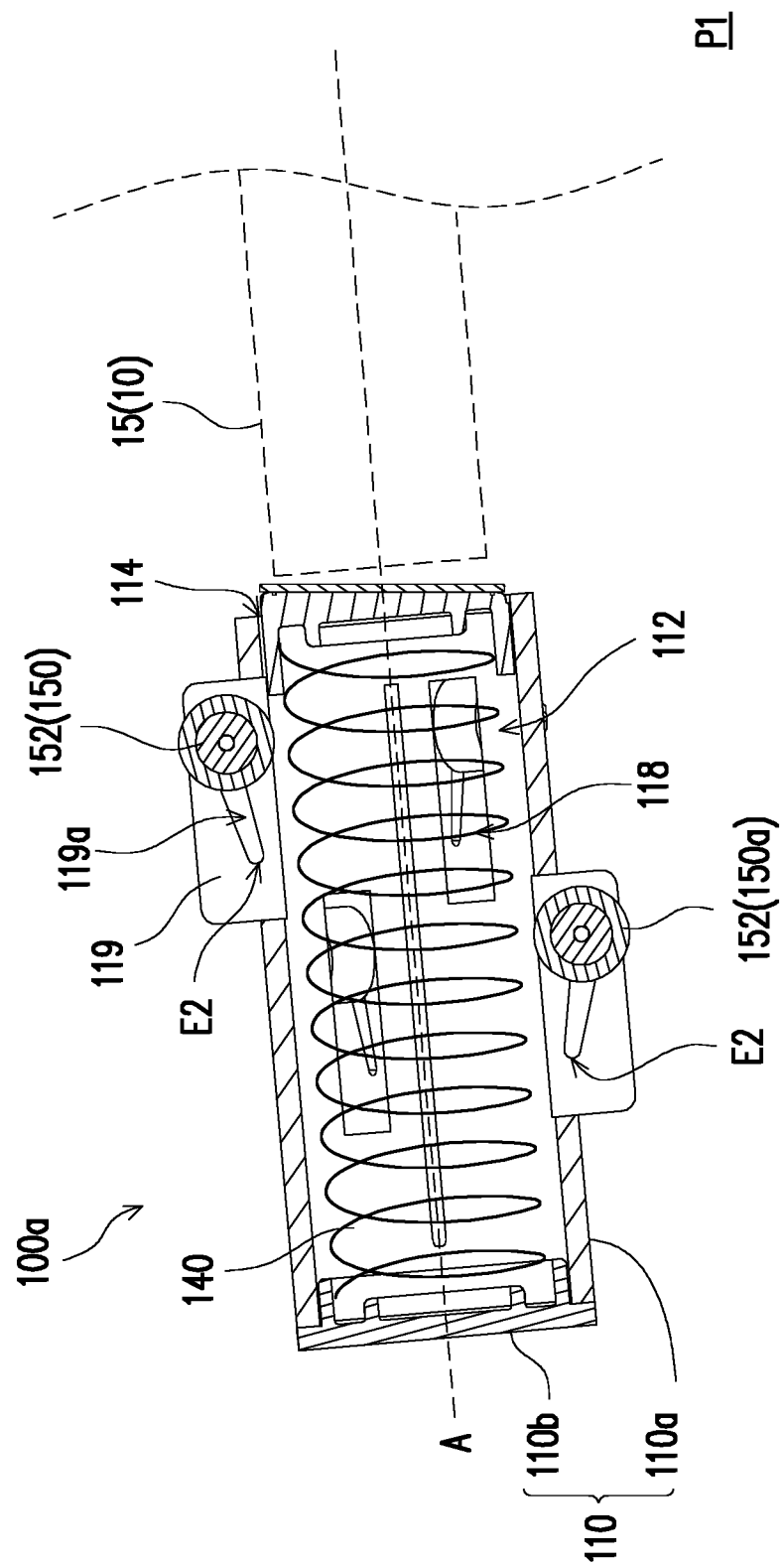
FIG. 7 is a partial cross-sectional view of the wine bottle fixing device of FIG. 5 before a wine bottle is inserted.
Figure 8:
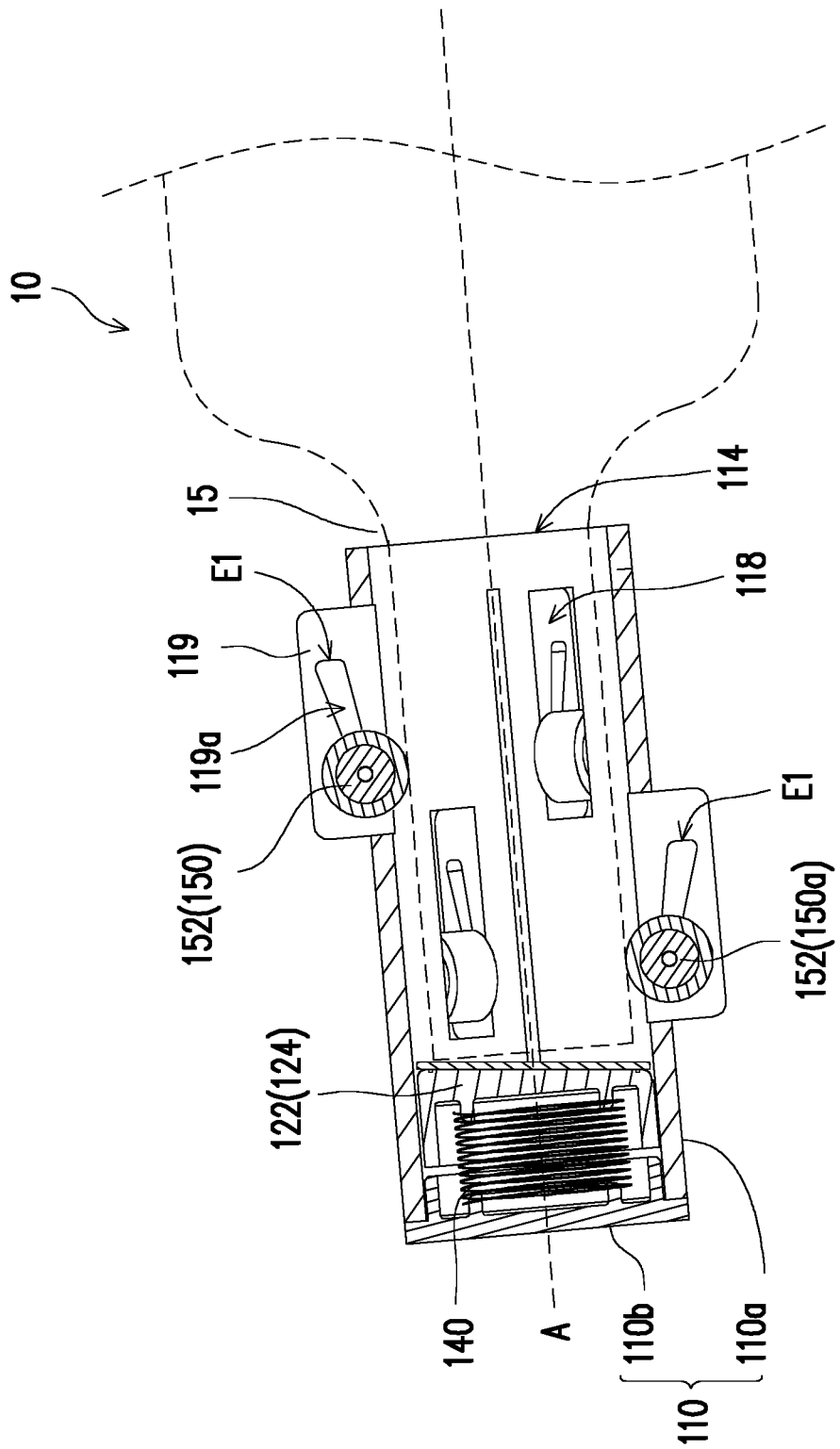
FIG. 8 is a partial cross-sectional view of the wine bottle fixing device of FIG. 5 when the wine bottle is inserted.

FIG. 7 is a partial cross-sectional view of the wine bottle fixing device of FIG. 5 before the wine bottle is inserted. FIG. 8 is a partial cross-sectional view of the wine bottle fixing device of FIG. 5 when the wine bottle is inserted. Referring to FIG. 7 and FIG. 8, each of the inclined tracks 119a includes a first end E1 (FIG. 8) and a second end E2 (FIG. 7) opposite to the first end E1. The first end E1 is close to the opening 114 and away from the wall surface 110a (i.e. away from the axis A), and the second end E2 is away from the opening 114 and close to the wall surface 110a (i.e. close to the axis A). In other words, when the rollers 152 are rolled from the first ends E1 to the second ends E2 along the inclined tracks 119a, the three rollers 152 in the roller set 150 are close to each other, and the three rollers 152 in the roller set 150a are close to each other. In the embodiment, a material of the rollers 152 is, for example, rubber or Teflon with high friction, though the material of the rollers 152 is not limited thereto.

Therefore, in the embodiment, during a process that the bottle neck portion 15 of the wine bottle 10 is inserted into the cylindrical body 110, the bottle neck portion 15 contacts the rollers 152, and drives the rollers 152 to roll from the first ends E1 to the second ends E2 along the inclined tracks 119a by the friction with the rollers 152 (FIG. 7 to FIG. 8), such that the rollers 152 gradually clamp the bottle neck portion 15 tight. Therefore, the wine bottle fixing device 100a may provide a more stable fixing effect to the bottle neck portion 15 of the wine bottle 10.

It should be noted that in the embodiment, when a thicker bottle neck portion 15 is inserted, the rollers 152 may probably only be able to roll a small distance from the first end E1 of the inclined track 119a, and the rollers 152 has already clamped the bottle neck portion 15 tight. When a thinner bottle neck portion 15 is inserted, the rollers 152 may probably roll from the first end E1 of the inclined track 119a to a position close to the second end E2 so that the rollers 152 clamp the bottle neck portion 15 tight. Therefore, according to such design, the wine bottle fixing device 100a of the embodiment may fix the bottle neck portion 15 with a larger diameter and size range.

Figure 9:
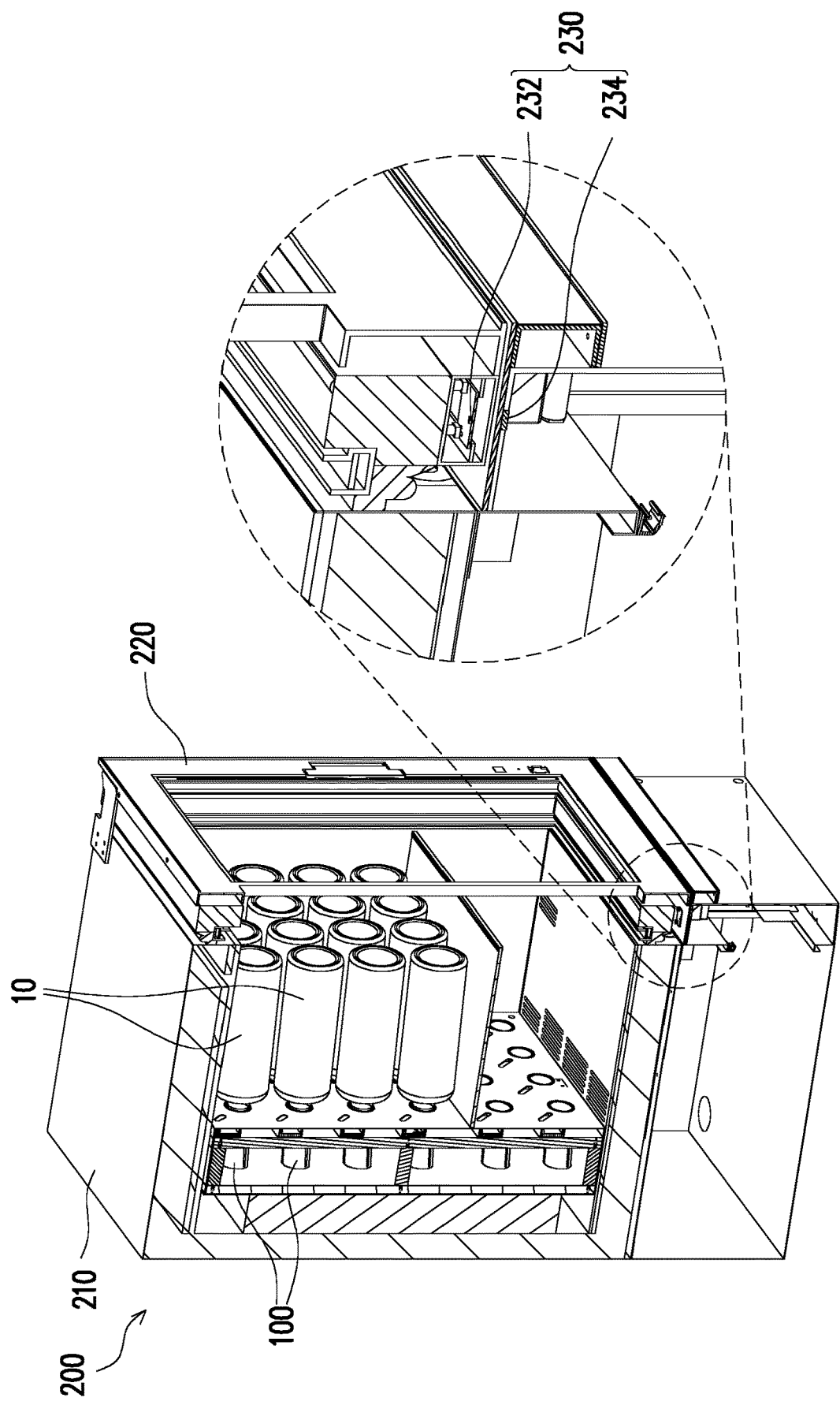
FIG. 9 is a cross-sectional view of the wine cabinet of FIG. 1 in a close state.
Figure 10:
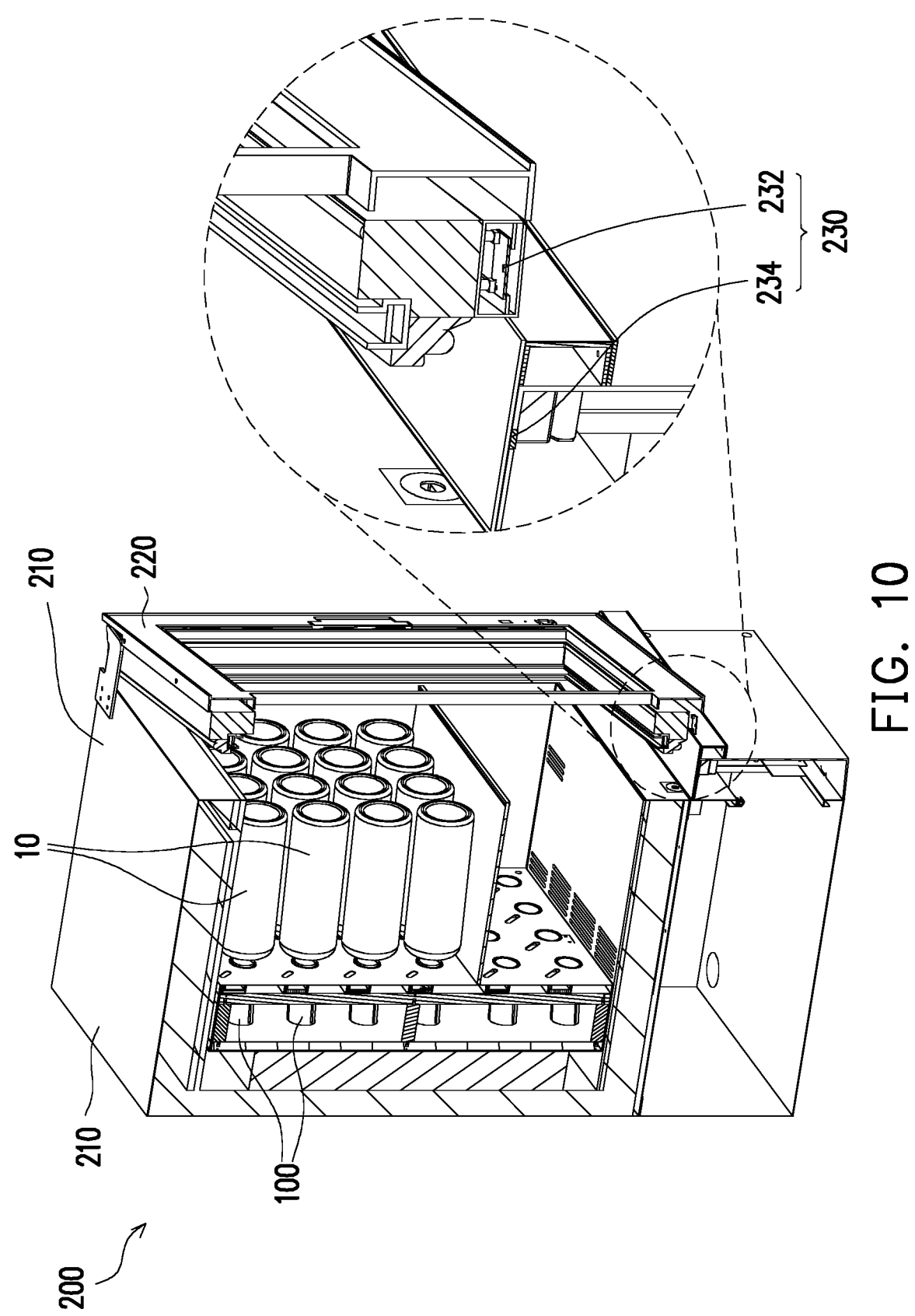
FIG. 10 is a cross-sectional view of the wine cabinet of FIG. 1 in an open state.

FIG. 9 is a cross-sectional view of the wine cabinet of FIG. 1 in a close state. FIG. 10 is a cross-sectional view of the wine cabinet of FIG. 1 in an open state. Referring to FIG. 9 and FIG. 10, in the embodiment, the wine cabinet 200 includes a cabinet body 210, a door plank 220 pivotally connected to the cabinet body 210, a plurality of the wine bottle fixing devices 100 disposed in the cabinet body 210 and a second sensing assembly 230.

In the embodiment, the second sensing assembly 230 includes a second sensor 232 and a second sensed component 234 corresponding to the second sensor 232. The second sensor 232 is, for example, disposed on the door plank 220, and the second sensed component 234 is, for example, disposed on the cabinet body 210. Therefore, when the door plank 220 is in the close state as shown in FIG. 9, the second sensor 232 is adapted to detect the second sensed component 234. When the door plank 220 is in the open state as shown in FIG. 10, the second sensed component 234 leaves a sensing range of the second sensor 232. Similarly, in other embodiments, the second sensor 232 may also be disposed on the cabinet body 210, and the second sensed component 234 may also be disposed on the door plank 220, which is not limited by the invention. Moreover, in the embodiment, the second sensed component 234 is a magnet, and the second sensor 232 is a magnetic sensor, and is, for example, a Hall effect sensing component. Certainly, in other embodiments, sensing principles and types of the second sensor 232 and the second sensed component 234 are not limited thereto.

Based on the above design, in the embodiment, the wine cabinet 200 has a function of reminding the user that the door plank 220 is not closed, so as to avoid a change of temperature and humidity in the wine cabinet 200 to affect the quality of the stored wines. For example, when the user forgets to close the door plank 220 or the door plane 220 is not completed closed, the second sensor 232 cannot detect the second sensed component 234. In this case, a warning sound may be sent to alert the user, and until the second sensor 232 detects the second sensed component 234 due to close of the door plank 220, sending of the warning sound is stopped, so as to achieve a power-saving effect or prevent deterioration of the wines stored in the wine cabinet 200. Certainly, in other embodiments, the second sensor 232 does not necessarily need to cooperate with the warning sound, and any design of the wine cabinet with the smart system may be adjusted according to an actual requirement.

It should be noted that in other embodiments, the sliding component 120, the rollers 152 and the second sensing assembly 230 of the invention may all be simultaneously or independently configured in the wine bottle fixing devices 100 and 100a. Moreover, in the figures of the invention, only two possibilities are illustrated as examples, and descriptions of other possibilities are omitted, though the invention is not limited thereto.

In summary, in the wine bottle fixing device of the invention, the sliding component is slidably disposed on the cylindrical body, and one of the sensed component and the sensor is disposed on the sliding component, and the other one is disposed beside the opening of the cylindrical body. Therefore, when the wine bottle is inserted into the wine bottle fixing device from the opening, the bottle neck portion of the wine bottle pushes the sliding component, so that the sensed value of the sensor sensing the sensed component is changed. In this way, the sensing assembly of the invention is capable of automatically detecting whether the wine bottle is put into the wine bottle fixing device. The wine cabinet is capable of efficiently managing storage time of the stored wines, and providing an objective basis for the user to judge whether the stored wine is suitable for drinking at this time point. Moreover, in the invention, based on the design of the rollers gradually inclined inward, the wine bottle fixing device may be adapted to the bottle neck portions with a larger size range.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A wine bottle fixing device, adapted for insertion of a bottle neck portion of a wine bottle to fix the wine bottle, the wine bottle fixing device comprising:
   a cylindrical body, surrounding an accommodating space and having an opening, wherein the bottle neck portion of the wine bottle is adapted to be inserted into the accommodating space through the opening;
   a sliding component, slidably disposed at the cylindrical body, and adapted to slide between a first position and a second position along an axis;
   a first sensing assembly, comprising a first sensor and a first sensed component corresponding to the first sensor, one of the first sensor and the first sensed component being disposed on the sliding component, and the other one being disposed on a sidewall of an opening end of the cylindrical body, wherein when the sliding component is located at the first position, the sliding component is located beside close to the opening, and the first sensor is adapted to detect the first sensed component, and when the bottle neck portion of the wine bottle is inserted into the cylindrical body, the wine bottle pushes the sliding component to slide from the first position to the second position, so that a sensed value of the first sensor sensing the first sensed component is changed; and
   an elastic component, disposed in the accommodating space, and located between a bottom wall of the cylindrical body and the sliding component, wherein when the bottle neck portion of the wine bottle is inserted into the cylindrical body, the bottle neck portion of the wine bottle pushes the sliding component to slide to the second position, the elastic component is compressed by the sliding component to accumulate elastic potential energy, and when the bottle neck portion leaves the cylindrical body, the elastic component is adapted to release the elastic potential energy to push the sliding component to return to the first position.

2. The wine bottle fixing device as claimed in claim 1, wherein the cylindrical body comprises a sliding chute formed on a wall surface and extending along the axis, the sliding chute is communicated with the accommodating space, the sliding component comprises a push portion located in the accommodating space and a protrusion portion connected to the push portion, the protrusion portion protrudes out of the cylindrical body from the sliding chute, and one of the first sensor and the first sensed component is disposed on the protrusion portion.

3. The wine bottle fixing device as claimed in claim 1, further comprising:
   at least one roller set, wherein each of the at least one roller set comprises a plurality of rollers, the cylindrical body comprises a plurality of slots formed on a wall surface and communicated with the accommodating space, and the rollers are rotatably disposed on the slots and partially stretched into the accommodating space, wherein when the bottle neck portion of the wine bottle is inserted into the accommodating space, the rollers are adapted to contact the wine bottle.

4. The wine bottle fixing device as claimed in claim 3, wherein the cylindrical body comprises a plurality of roller frames corresponding to the slots, the roller frames are located at an outer side of the wall surface of the cylindrical body, each of the roller frames has an inclined track, a shaft rod of each of the rollers penetrates through the inclined track, each of the inclined tracks comprises a first end and a second end opposite to each other, the first end is located closer to the opening than the wall surface, and the second end is located closer to the wall surface than the opening.

5. The wine bottle fixing device as claimed in claim 3, wherein the number of the at least one roller set is two, and one of the roller sets is disposed around a sidewall of an opening end the cylindrical body, and the other one of the roller sets is disposed around the cylindrical body and is away from the opening.

6. The wine bottle fixing device as claimed in claim 5, wherein orthographic projections of the rollers of the roller sets on a bottom wall of the cylindrical body are staggered from each other.

7. The wine bottle fixing device as claimed in claim 1, wherein the first sensor is a magnetic sensor, and the first sensed component is a magnet.

8. A wine cabinet, comprising:
   a cabinet body;
   a door plank, pivotally connected to the cabinet body; and
   a plurality of the wine bottle fixing devices as claimed in claim 1, disposed in the cabinet body.

9. The wine cabinet as claimed in claim 8, further comprising:
   a second sensing assembly, comprising a second sensor and a second sensed component corresponding to the second sensor, one of the second sensor and the second sensed component being disposed on the door plank, and the other one being disposed on the cabinet body, wherein when the door plank is closed, the second sensor is adapted to detect the second sensed component, and when the door plank is rotated relative to the cabinet body to open, the second sensed component leaves a sensing range of the second sensor.

10. The wine cabinet as claimed in claim 8, wherein the cylindrical body comprises a sliding chute formed on a wall surface and extending along the axis, the sliding chute is communicated with the accommodating space, the sliding component comprises a push portion located in the accommodating space and a protrusion portion connected to the push portion, the protrusion portion protrudes out of the cylindrical body from the sliding chute, and one of the first sensor and the first sensed component is disposed on the protrusion portion.

11. The wine cabinet as claimed in claim 8, wherein the wine bottle fixing device further comprises:
   at least one roller set, wherein each of the at least one roller set comprises a plurality of rollers, the cylindrical body comprises a plurality of slots formed on a wall surface and communicated with the accommodating space, and the rollers are rotatably disposed on the slots and partially stretched into the accommodating space, wherein when the bottle neck portion of the wine bottle is inserted into the accommodating space, the rollers are adapted to contact the wine bottle.

12. The wine cabinet as claimed in claim 11, wherein the cylindrical body comprises a plurality of roller frames corresponding to the slots, the roller frames are located at an outer side of the wall surface of the cylindrical body, each of the roller frames has an inclined track, a shaft rod of each of the rollers penetrates through the inclined track, each of the inclined tracks comprises a first end and a second end opposite to each other, the first end is located closer to the opening the wall surface, and the second end is located closer to the wall surface than the opening.

13. The wine cabinet as claimed in claim 11, wherein the number of the at least one roller set is two, and one of the roller sets is disposed around a sidewall of an opening end the cylindrical body, and the other one of the roller sets is disposed around the cylindrical body and is away from the opening.

14. The wine cabinet as claimed in claim 13, wherein orthographic projections of the rollers of the roller sets on a bottom wall of the cylindrical body are staggered from each other.

15. The wine cabinet as claimed in claim 8, wherein the first sensor is a magnetic sensor, and the first sensed component is a magnet.

* * * * *